(12) United States Patent
Hosaka et al.

(10) Patent No.: US 7,621,045 B2
(45) Date of Patent: Nov. 24, 2009

(54) METHOD OF PRODUCING A PROBE WITH A TRAPEZOIDAL CONTACTOR

(75) Inventors: Hisatomi Hosaka, Yamanashi (JP); Kiyoshi Takekoshi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 198 days.

(21) Appl. No.: 11/671,346

(22) Filed: Feb. 5, 2007

(65) Prior Publication Data
US 2007/0124932 A1  Jun. 7, 2007

Related U.S. Application Data

(63) Continuation of application No. 10/502,099, filed as application No. PCT/JP02/12984 on Dec. 11, 2002, now Pat. No. 7,256,592.

(30) Foreign Application Priority Data
Jan. 22, 2002 (JP) ............... 2002-012426

(51) Int. Cl.
    *H01R 43/04* (2006.01)
(52) U.S. Cl. .............. 29/882; 29/846; 29/874; 29/876; 29/879
(58) Field of Classification Search .......... 29/825, 29/846, 874, 876, 879, 884, 882, 994
    See application file for complete search history.

(56) References Cited

U.S. PATENT DOCUMENTS

| | | | |
|---|---|---|---|
| 4,755,747 A | 7/1988 | Sato | |
| 5,116,462 A * | 5/1992 | Bartha et al. | 216/2 |
| 5,518,964 A * | 5/1996 | DiStefano et al. | 438/113 |
| 5,634,586 A | 6/1997 | Kimura et al. | |
| 6,014,032 A * | 1/2000 | Maddix et al. | 324/762 |
| 6,059,982 A * | 5/2000 | Palagonia et al. | 216/11 |
| 6,091,124 A * | 7/2000 | Bayer et al. | 257/417 |
| 6,232,143 B1 * | 5/2001 | Maddix et al. | 438/100 |
| 6,256,882 B1 * | 7/2001 | Gleason et al. | 29/874 |
| 6,307,392 B1 | 10/2001 | Soejima et al. | |
| 6,328,902 B1 * | 12/2001 | Hantschel et al. | 216/11 |
| 6,358,426 B1 * | 3/2002 | Muramatsu et al. | 216/11 |
| 6,482,013 B2 | 11/2002 | Eldridge et al. | |
| 6,578,264 B1 * | 6/2003 | Gleason et al. | 29/874 |
| 6,690,186 B2 * | 2/2004 | Fjelstad | 324/762 |

(Continued)

FOREIGN PATENT DOCUMENTS

EP  230 348  7/1987

(Continued)

OTHER PUBLICATIONS

IBM Technical Disclosure Bulletin, Gladstein et al., vol. 22, No. 7, p. 2824 Dec. 1979.

*Primary Examiner*—C. J Arbes
(74) *Attorney, Agent, or Firm*—Oblon, Spivak, McClelland, Maier & Neustadt, L.L.P.

(57) ABSTRACT

A probe is disclosed, comprising a beam 4B, which has a front end 4b1, an intermediate portion 4b2 and a base end 4b3, the front end being a portion for contacting a test subject through a contactor, the base end being a portion for fixing the probe; and a substantially trapezoidal contactor 4A, which is fixed to the leading end 4b1 of the beam.

1 Claim, 15 Drawing Sheets

U.S. PATENT DOCUMENTS

| | | |
|---|---|---|
| 6,713,374 B2 | 3/2004 | Eldridge et al. |
| 6,933,738 B2 | 8/2005 | Martin et al. |
| 7,073,254 B2 | 7/2006 | Eldridge et al. |
| 2001/0009376 A1 | 7/2001 | Takekoshi et al. |
| 2003/0030455 A1 | 2/2003 | Tanioka et al. |

FOREIGN PATENT DOCUMENTS

| | | |
|---|---|---|
| JP | 4-340733 | 11/1992 |
| JP | 10-19991 | 1/1998 |
| JP | 2000-121673 | 4/2000 |
| JP | 2000-227444 | 8/2000 |
| JP | 2000-241457 | 9/2000 |
| JP | 2001-165956 | 6/2001 |
| JP | 2001-281268 | 10/2001 |
| WO | 96/37332 | 11/1996 |

\* cited by examiner

METHOD OF PRODUCING A PROBE WITH A TRAPEZOIDAL CONTACTOR

CROSS-REFERENCE TO RELATED APPLICATIONS

This application is a continuation of and is based upon and claims the benefit of priority under 35 U.S.C. §120 for U.S. Ser. No. 10/502,099, filed Jul. 22, 2004, and claims the benefit of priority under 35 U.S.C. § 119 from a National Stage of PCT/JP02/12984, filed Dec. 11, 2002, Japanese Patent Application No. 2002-12426, filed Jan. 22, 2002, the entire contents of each which are incorporated herein by reference.

FIELD OF THE INVENTION

The present invention relates to a probe used for inspecting electrical characteristics of semiconductor devices having a shape of, e.g., a semiconductor wafer, a method for manufacturing the probe, a probe array, a method for manufacturing the probe array, a method for attaching the probe, an apparatus for attaching the probe, a probe card and a probe array maintenance unit.

BACKGROUND OF THE INVENTION

A probe card is used to inspect electrical characteristics of a test subject, for example, a semiconductor device (IC chip) such as a memory circuit or a logic circuit, formed on a semiconductor wafer (hereinafter, referred to as a wafer for simplicity) in large numbers. The probe card includes a plurality of probes, each of the probes being installed to be correspondent to a plurality of electrode pads formed on the test subject (for example, IC chip). Each probe makes an electrical connection between a tester and the IC chip by contacting electrically with the electrode pad of the IC chip, thereby rendering inspection signals delivered between the tester and the IC chip.

Recently, an array of the electrode pads becomes narrow-pitched as the IC chip is highly integrated, thereby an array of the probes becoming narrow-pitched. The probe card has been proposed to accommodate such a trend of the narrow pitching of the probes in, e.g., Japanese Laid-open Publication No. 8-50146 or No. 11-133062.

Technologies disclosed therein are all based on a lithography technology and using same. In the technologies, to arrange the probes correspondently to an array of the plurality of inspecting electrodes, the plurality of probes are formed simultaneously on a surface of a contactor substrate made of, e.g., a ceramic, silicon or the like. The probe installed in the probe card includes a contactor electrically contacting with, e.g., the inspecting electrode and a beam maintaining the contactor at a leading end thereof. The probes are arranged on the contactor substrate in a predetermined array, thereby making each of a plurality of contactors electrically contact with a different one of the inspecting electrodes.

However, to adopt the lithography technology, a photomask needs to have a pattern corresponding to an array pattern of the probes in the probe card. In other words, the probes should be manufactured by using the specific photomask. Further, the probe includes a plurality of parts, e.g., the contactor and the beam. To manufacture the plurality of parts, a plurality of photomasks needs to be provided. Lately, the number of kinds of the test subject increases in an era of small quantity batch production. It is required that the probe card should be appropriately used for each of the various kinds of the test subjects, the number of which increases nowadays. Accordingly, the required number of the photomasks increases greatly such that lots of time and cost are needed for manufacturing the photomasks, thereby also increasing the cost for manufacturing the probe card.

SUMMARY OF THE INVENTION

It is, therefore, an object of the present invention to provide a solution to at least one of the problems described above. In accordance with one aspect of the present invention, it is a primary object of the present invention to provide a probe and a method for the manufacture thereof which may be commonly and generally used for the probe cards, each of which having a different array pattern of the probes.

In accordance with another aspect of the present invention, it is another object of the present invention to provide a probe and a method for the manufacture thereof to make a small quantity of many kinds of the probe cards.

In accordance with still another aspect of the present invention, it is still another object of the present invention to provide a probe and a method for manufacturing the probe card, which do not require the various kinds of photomasks.

In accordance with still another aspect of the present invention, it is still another object of the present invention to provide a probe attaching method and a probe attaching apparatus for manufacturing different kinds of probe cards at a low cost by attaching each of probes based on the array pattern of the probes necessitated by the probe card.

Hereinafter, still other objects and advantages of the present invention will be described in the specification below and a portion of the objects and advantages may be obvious from a disclosure therein or achievable by an execution of the present invention. The objects and advantages of the present invention mentioned above may be executed and achieved by each means and a combination thereof particularly described herein.

In accordance with a first aspect of the present invention, there is provided a probe which contacts with an electrode of a test subject formed on a substrate and is used for inspecting electrical characteristics of the test subject. The probe includes:

a beam (the beam includes a leading end, an intermediate portion and base end, the leading end being a portion making a contact with the test subject via a contactor and the base end being the portion fixing the probe), and a contactor having a substantially trapezoidal shape (the contactor is installed at the leading end of the beam).

The probe provided by the first aspect of the present invention preferably further includes [a] and [b] or a combination thereof:

[a] The trapezoidal shape of the contactor that is a substantially square coned trapezoidal shape.

[b] The beam that is bent toward the contactor at the base end or the intermediate portion thereof.

In accordance with a second aspect of the present invention, there is provided a method for manufacturing the probe in accordance with the first aspect of the present invention by using the lithography technology, the method including the steps of:

forming on a silicon substrate a plurality of recessed portions (groove portions), each having a substantially trapezoidal shape, by using an anisotropic etching technique (herein, an area of a top surface of the trapezoidal shape is controlled by adjusting an etching time); and forming a plurality of probes by using a film forming technique on the silicon substrate (herein, a contactor is formed inside each recessed portion having the trapezoidal shape and at the same time the beam is formed on the silicon substrate together with the contactor as a single body).

The method for manufacturing the probe provided by the second aspect of the present invention preferably further includes the step of [c] below:

[c] forming a peeling layer at least on a portion of a surface of the silicon substrate where the probes are formed after the step of forming the plurality of recessed portions having the trapezoidal shape on the silicon substrate.

In accordance with a third aspect of the present invention, there is provided a probe array that is used in a manufacturing process of a probe card. The probe array includes:

a second film-shaped supporting body; and a plurality of probes, each being recited in claim 1, adhered onto one surface of the second film-shaped supporting body.

The probe array provided in accordance with the third aspect of the present invention preferably further includes [d] to [f] below or a combination thereof:

[d] At least portions of one surface of the second film-shaped supporting body where the probes are attached having an adhesive property, and an adhesive strength thereof that can be varied by heat or ultraviolet light.

[e] For each beam of a plurality of probes, a beam surface where a corresponding contactor is installed being adhered to the surface of the second film-shaped supporting body having an adhesive property, and

[f] The plurality of probes being arranged in various directions on a film.

In accordance with a forth aspect of the present invention, there is provided a method for manufacturing the probe array. The method includes the steps of:

[1] forming the plurality of probes on the silicon substrate by the manufacturing method in accordance with the second aspect of the present invention;

[2] transferring the plurality of probes formed on the silicon substrate onto one of surfaces of a first film-shaped supporting body simultaneously;

[3] deteriorating an adhesive property of the surface of the first film-shaped supporting body; and

[4] transferring the plurality of probes onto said one surface of the second film-shaped supporting body by adhering the latter onto said one surface of the first film-shaped supporting body.

The method for manufacturing the probe array preferably further includes [g] to [h] below or a combination thereof:

[g] One surface of the first film-shaped supporting body having the adhesive property, wherein an adhesive strength thereof can be varied by heat or ultraviolet light;

[h] The forming step [1] further including the following steps:

[1a] forming a peeling layer on the silicon substrate prior to forming the plurality of probes on the silicon substrate; and

[1b] eliminating parts of the peeling layer prior to transferring the plurality of probes formed on the silicon substrate onto one surface of the first film-shaped supporting body simultaneously.

In accordance with a fifth aspect of the present invention, there is provided a method for attaching a base end of a probe to a supporting column placed on a card shaped substrate. The method includes:

installing the base end of the probe having the trapezoidal contactor and accommodated in a probe array on an attaching contact surface of the supporting column on the card shaped substrate; and fixing the base end of the probe to the supporting column.

The attaching method provided by the fifth aspect of the present invention preferably includes the step of fixing the base end of the probe to the supporting column by pressing a leading end of an ultrasonic bonder against an upper side of the base end of the probe (herein, the leading end of the ultrasonic bonder has a crossed protrusion, a cross section of the protrusion being of a substantially semicircle, and a beam of the probe is bent toward the contactor by fixing the base end of the probe to the supporting column by using the ultrasonic bonder).

In accordance with a sixth aspect of the present invention, there is provided an apparatus for attaching a base end of a probe having a trapezoidal contactor to a card shaped substrate. The apparatus includes:

a unit for installing the base end of the probe arranged in the probe array to an upper portion of the supporting column of the substrate;

a unit for fixing the base end of the probe to the supporting column.

The attaching apparatus provided by the sixth aspect of the present invention preferably further includes [i] and [j] or a combination thereof:

[i] The fixing unit being an ultrasonic bonder having the leading end, the leading end thereof being equipped with the protrusion.

[j] The protrusion at the leading end of the ultrasonic bonder substantially having a formation that semi-cylinder shaped protrusions are crossing each other.

In accordance with a seventh aspect of the present invention, there is provided a probe card having a plurality of probes. The probe card includes:

a probe card main body (the probe card main body has a first surface and a second surface, a plurality of first terminals being installed on the first surface thereof, a plurality of second terminals being installed on the second surface thereof, wherein each of the second terminals is connected to a different one of the supporting columns electrically, and a first terminal is the supporting column); and a plurality of probes having a substantially trapezoidal contactor (the base end of each probe is fixed to a different one of supporting columns).

The probe card provided by the seventh aspect of the present invention preferably further includes [k] and [o] or a combination thereof:

[k] A contactor of each probe substantially having a form of a square coned trapezoid;

[l] The probe being bent toward the contactor at a place between a base end and an intermediate portion thereof;

[m] The probe card main body further including a stopper;

[n] The stopper being made of a same material as the supporting column and having an electric insulating film on a peripheral surface thereof including a contact surface with a surface of a test subject; and

[o] The probe card main body including a plurality of alignment marks on the first surface thereof.

In accordance with an eighth aspect of the present invention, there is provided a probe array supporting unit for supporting the probe array with a predetermined tension. The probe array supporting unit includes:

a first fixing part (the first fixing part is a first frame shaped structure);

a second fixing part (the second fixing part is a second frame shaped structure and is overlapped with the first fixing part via the probe array, herein, while the second fixing part is overlapped with the first fixing part, the probe array described in claim 6 being supported by both fixing parts under a predetermined tension); and a locking part (the locking part locks and fixes the overlapped first and second fixing parts).

The probe array supporting unit preferably further includes [p] below:

[p] The first fixing part being a first frame shaped structure having a first lower surface and a first upper surface, wherein the first upper surface is a first slant surface declining from an outer circumference to an inner circumference of the first frame shaped structure; and the second fixing part (the second fixing part is piled on the first fixing part and is a second frame shaped structure having a second lower surface and a second upper surface, wherein the second lower surface is a second slant surface declining from an outer circumference to an inner circumference of the second frame shaped structure and substantially having a same slant angle as that of the first slant surface).

BEST MODE FOR CARRYING OUT THE INVENTION

Figure 1A:
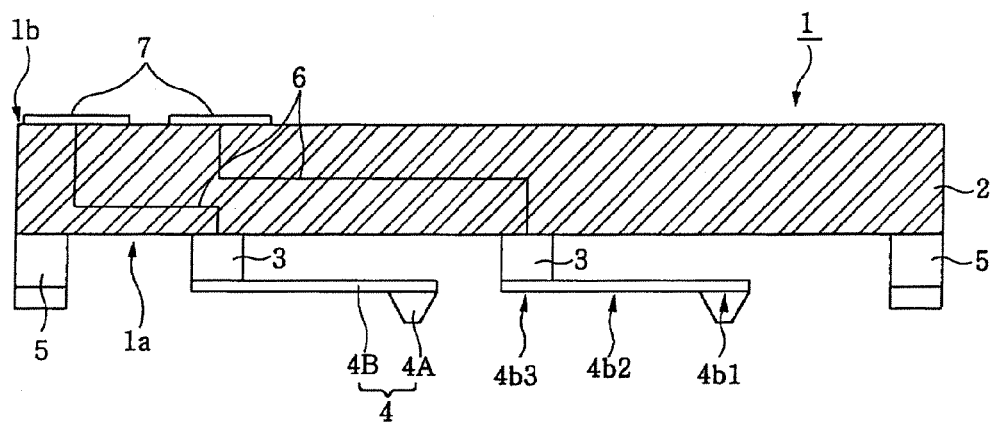
FIG. 1A shows a sectional view of a probe card having a probe in accordance with an embodiment of the present invention.

Hereinafter, the present invention is described in accordance with a first embodiment with reference to FIGS. 1 to 8E.

A probe in accordance with the present invention is not only used to be attached to a probe card, but also may be adopted for various usages such as a probe to be attached as a terminal for diverse measurement devices, a terminal of an electronics circuit, and the like. Herein, from an aspect of explaining the probe of the present invention more concretely, the probe attached to the probe card will be described. However, the probe in accordance with the present invention is not limited to a usage for being attached to the probe card. An embodiment of the probe card to which the probe of the present invention is attached will now be described with reference to FIGS. 1 to 3.

As shown in FIGS. 1A, 1B and FIGS. 2A, 2B, the probe card 1 includes a card shaped substrate (hereinafter, referred to as a probe card main body) 2, and the probe card main body 2 has a first surface 1a and a second surface 1b. On the first surface thereof, installed is a plurality of supporting columns 3 (hereinafter, referred to as a bump) connected to the probes electrically. On the second surface thereof, installed is a plurality of second terminals 7. Each of the bumps is connected to a different one of the second terminals by a wiring layer 6 electrically. The bumps 3 and the second terminals 7 are preferably made of a conductive metal (e.g., copper).

The probe card main body 2 includes a plurality of probes 4. Each of the probes 4 includes a beam 4B and a contactor 4A and the beam 4B has a leading end 4b1, an intermediate portion 4b2 and a base end 4b3. The contactor 4A is installed at the leading end 4b1 of the beam 4B. The contactor 4A preferably has a form of a trapezoid. A top portion of the contactor having the trapezoidal form may have various forms such as a flat plate, a hemisphere (having a semi-diameter of, e.g., 10 μm) and a plate having some irregularities. The contactor 4A having the trapezoidal form may contact with the electrode of the test subject. For easiness of a manufacturing, it is preferable that the contactor has substantially a square coned trapezoidal form. The contactor having the square coned trapezoidal form may be easily manufactured by using a silicon substrate.

The base end 4b3 of the beam 4 is fixed at the bump 3 and electrically connected thereto and, consequently, the contactor 4A is connected to the second terminal 7 electrically via a path of the beam 4B, the bump 3 and the wiring layer 6. The second terminal 7 may be connected to a tester T.

The probe card main body 2 may further include a stopper 5. The stopper 5 may be installed to control a contact pressure (probe pressure), when a plurality of probes 4 contact the electrodes of a test subject (hereinafter, referred to as an IC chip) during an inspection thereof. In the mean time, the stopper 5 may be installed to mitigate an impact of a collision or a contact between a main chuck and the probe card main body 2, when a wafer W loaded on the main chuck is lifted toward the probe card main body 2.

Figure 2A:
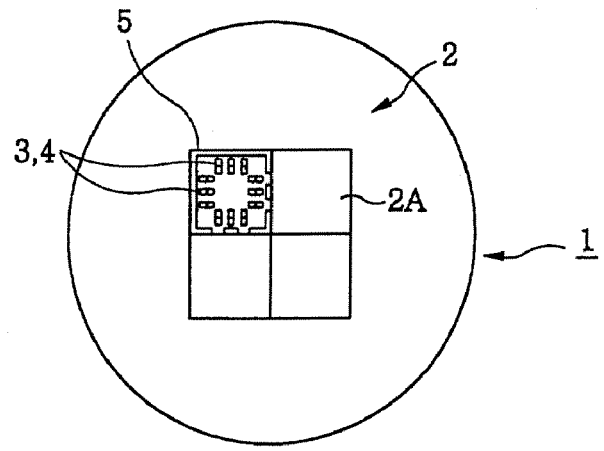
FIG. 2A presents a planar view of a surface of the probe card shown in FIG. 1A, the probe being arranged thereon.
Figure 2B:
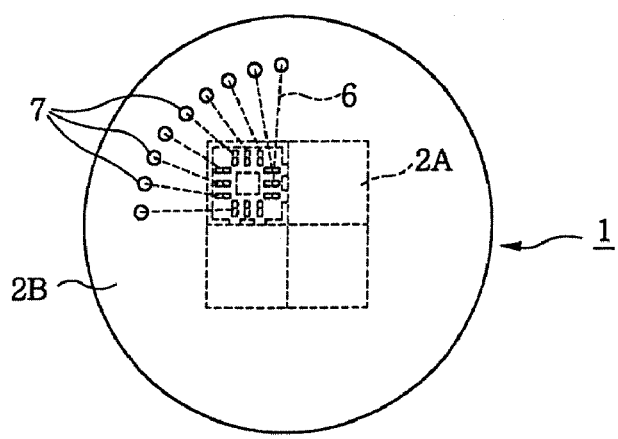
FIG. 2B is a planar view of an opposite surface thereof presented in FIG. 2A.

By having contact with each electrode pad W1 (made of a conductive metal, e.g., aluminum, gold, etc.) of the IC chip formed on the wafer W, the contactor 4A of the probe 4 connects the IC chip to the tester via the above-described path. Consequently, there may be inspected electrical characteristics of a plurality (for example, 16 or 32) or one of IC chips formed on the wafer W. The probe card main body 2 may be formed approximately as a shape of circle, which is shown in FIGS. 2A and 2B. At a central area 2A of a surface of the probe card main body 2, four regions 2A may be arranged, thereby a plurality of probes arranged radially in each of regions, for example as shown in FIG. 2A.

Each of a plurality of probes 4 may be arranged radially such that the base end 4$b$3 contacting with the bump 3 faces an inner side thereof and the leading end 4$b$1 where the contactor 4A is provided faces an outer side thereof. In the radial arrangement above, conversely, the leading end 4$b$1 and the base end 4$b$3 may face the inner side and the outer side thereof, respectively. At a peripheral region 2B of a reverse surface of the probe card main body 2, a plurality of second terminals 7 are arrayed in a shape of ring and each second terminal 7 may be connected to the bump 3 electrically via the wiring layer 6 as shown in FIG. 2B.

Each of the plurality of probes 4 includes the contactor 4A having a substantially trapezoidal form, more preferably square coned trapezoidal form and the beam 4B combining a lid to maintain the contactor 4A at the leading end (freedom end) 4$b$1. The contactor 4A may have a top portion of various forms such as a flat plate, a hemisphere (having a semi-diameter of, e.g., 10 um) and a plate having some irregularities. The contactor 4A and the beam 4B of the probes 4, each of probes having contact with a different one of a plurality of electrode pads W1 of the IC chip formed on the wafer W, may be preferably made of a conductive metal (e. g, nickel) as a single body, which is of higher hardness than that of the electrode pad W1 on the wafer W. Furthermore, the contactor 4A and the beam 4B are preferably made of a material having an elasticity (e.g., nickel). In an inspection state shown in FIG. 1B, each of the plurality of contactors 4A of the probes 4 contacts with a different one of the plurality of electrode pads W1 of the IC chip formed on the wafer W. Each of contactors 4A is preferably pressed against each of electrode pads with a probe pressure larger than or equal to 1.5 g/unit in the inspection state shown in FIG. 1B. The probe pressure is generally controlled by an elasticity force of the plurality of beams 4B and a gap between the contactor 4A and the electrode of the IC chip. However, when the stopper 5 is adopted, the stopper 5 may contribute to the control of the probe pressure. The elasticity force of the beam 4B may absorb the difference of height among the plurality of electrodes W1 by making the contactor 4A of the probe 4 contact with the electrode W1 of the IC chip on the wafer W, and simultaneously connecting the contactor 4A thereof to the electrode W1 thereof.

Figure 3:
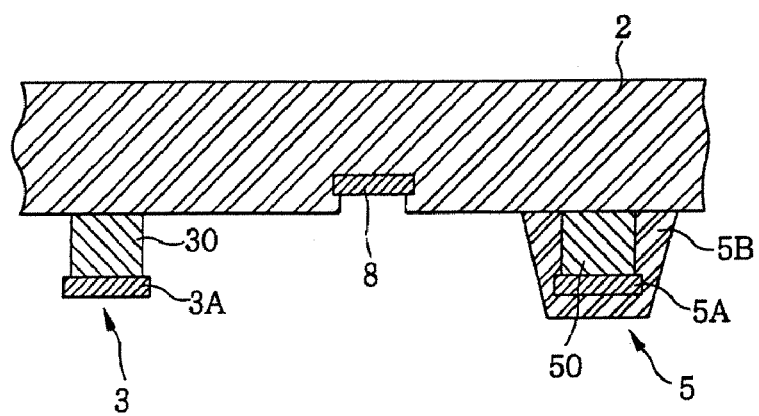
FIG. 3 describes a magnified sectional view of a portion of the probe card shown in FIG. 1.

In FIG. 3, the bump 3 of the probe card main body 2 and the stopper 5 provided on necessity may include, e.g., a copper coating layer (30, 50) and an insulating film 5B.

Figure 1B:
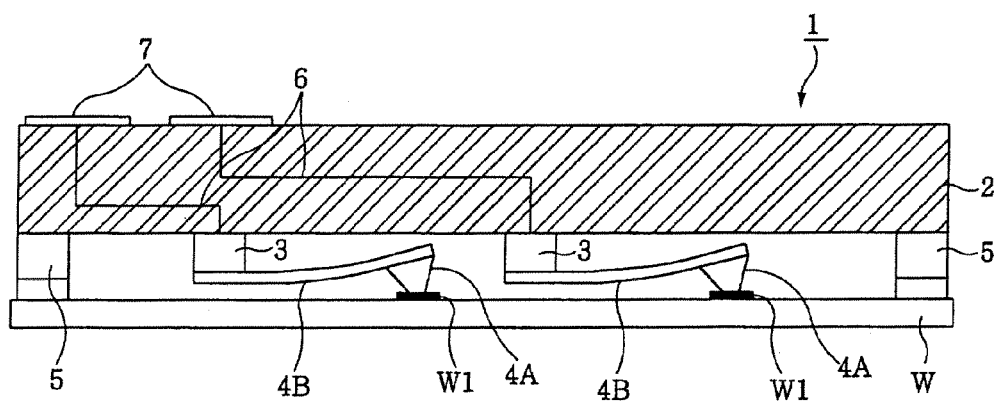
FIG. 1B illustrates an operation when the probe card shown in FIG. 1A performs an inspection of a wafer.

The bump 3 may be configured, i.e., by forming the copper coating layer on the surface of the card main body 2 and by etching a certain portion of the copper coating layer. Or, the copper coating layer 30 and the copper coating layer 50 may be made by employing a film forming technology such as a CVD or a sputtering. On each lower surface of the copper coating layer 30 of the plurality of bumps 3 may be formed a gold coating layer 3A while on each lower surface of the copper coating layer 50 may be formed a gold coating layer 5B, as shown in FIG. 3. A manufacturing process may be simplified by making each height of the gold coating layers 3A and 5A equal and forming the insulating film 5B thereon. The gold coating layer 3A on the bump 3 facilitates the electrical connection to the probe 4. The height of the bump 3 is determined so that the electrode W1 should not contact with the probe card main body 2, for example, 37 μm (including the height of the gold coating layer, e.g., 2 μm). As shown in FIGS. 2A and 2B schematically, the stopper 5 may be provided to a place such as scrub line, and the like, which does not contact with the IC chip formed on the wafer W, when the contactor 4A contacting with the electrode W1. As shown in FIG. 3, at least a surface of a lower portion of the stopper 5 is preferably coated by the insulating layer 5B made of, e.g., polyimide. The insulating layer 5B may provide the bump 3 with more height from the probe card main body 2 by the thickness of the insulating layer 5B, e.g., 25 to 30 μm (FIGS. 1A, 1B).

The stopper 5 is preferably formed together with the bump 3 and includes the copper coating layer 50 and gold coating layer 5A, as described above. However, the stopper 5 may possibly include the insulating layer 5B only. For a case of including insulating layer 5B only, the insulating layer 5B also preferably provides more height from the probe card main body 2 by the thickness of the insulating layer 5B, e.g., 25 to 30 μm than the bump 3 (FIGS. 1A, 1B).

As shown in FIG. 3, an alignment mark 8 is preferably formed on the probe card main body 2 for matching a position when attaching the probe 4. The alignment mark 8 may be formed by recording a mark on the probe card main body 2 or by adhering a mark thereon. Further, the alignment mark 8 is formed by performing a hole-making process to the probe card main body 2 from the surface thereof to the wiring layer 6 installed therein by using, e.g., a laser. The alignment mark 8 is certainly distinguishable by a camera by using the difference of a contrast between the wiring layer 6 and the probe card main body 2, which will be described later.

Figure 4A:
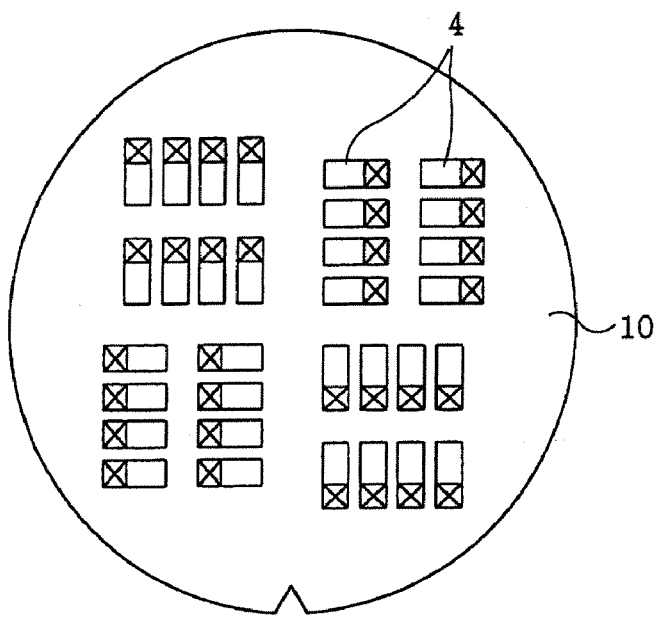
FIG. 4A depicts a planar view of a silicon substrate on which the probes are framed and FIG. 4B shows a magnified sectional view of the probe depicted in FIG. 4A.

Next, an embodiment of manufacturing the probe will be described with reference to FIGS. 4A, 4B and FIGS. 5A to 5G. A plurality of probes 4 may be formed, e.g., on the silicon substrate 10 arranged as shown in FIG. 4A in accordance with the embodiment. When the probes 4 are formed on the silicon substrate 10, the silicon substrate 10 may be divided into a plurality of regions (i.e., four regions). In each region, the probes may be arranged in different directions.

By arraying the probes 4 in the plural directions, there may be acquired a degree of freedom for an attaching direction of each probe when attaching the base end 4$b$3 of each probe to the bump 3 of the probe card main body 2.

Moreover, the probe 4 may be formed on the silicon substrate 10 with a predetermined arrangement density. An adjustment in the arrangement density facilitates a performance of transference from the silicon substrate 10 shown in FIG. 5.

Figure 4B:
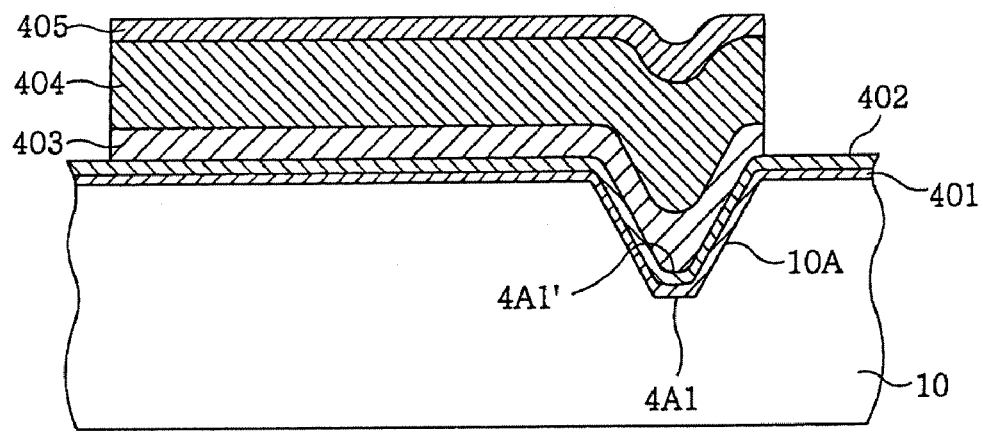

Referring to FIGS. 4A and 4B, a plurality of probes 4 may be formed on the silicon substrate 10 by following a sequence of a lithography technology described below.

On the silicon substrate 10, it is performed a Si crystal anisotropy etching by using a conventional etching method (e.g., wet etching using an alkali family solution). Further, there may be formed a recessed portion (frame) 10A having a substantially trapezoidal shape, preferably reverse square coned trapezoidal shape. The recessed portion may be formed by performing an etching based on a surface direction and by using an anisotropy property of the silicon. An extent of a lower surface of the frame 10A (a top surface 4A1 of the contactor 4A having the trapezoidal shape) may be controlled to a predetermined size by adjusting the etching duration. By this controlling thereof, the extent at each lower surface of a plurality of frames 10A formed on the silicon substrate 10 may be controlled uniformly. A surface of a leading end preferably has a shape of a regular square, each side of which is about 10 μm.

On the surface of the silicon substrate 10, a plurality of recessed portions 10A being formed thereon, an electrode film (e.g., titan film) 401 may be formed, by using a film forming technology (e.g., sputtering technology).

By using a gold coating electrode 401, a peeling layer (e.g., a copper coating layer) 402 may be formed on the surface of an identical electrode film with a depth of, e.g., 1 µm.

On the surface of the silicon substrate 10, a resist is sprayed with a depth of, e.g., 25 µm. By performing an exposure, a development and an etching process of a surface of a resist film formed thereby, the resist film having a predetermined pattern is formed thereon. On the patterned resist film as shown in FIG. 4A, an opening is formed at a place corresponding to the plurality of contactors 4A (i.e., a position of the frame 10A) and at a place corresponding to the probes 4.

On the upper surface of the peeling layer 402 exposed at the opening of the resist film, a contact layer (e.g., palladium (Pd) layer) 403 of the contactor 4A is formed. Next, a beam layer (e.g., Nickel (Ni) layer with a depth of 20 µm) 404 is formed. Sequentially, a gold (Au) layer 405 having a depth of, e.g., 2 µm may be formed. The gold layer 405 is preferably formed to facilitate a contact between the bump 3 and the base end 4b3 of the probe 4.

A whole resist film is eliminated. By a process described above, the plurality of probes 4 are formed in an arranged pattern shown in FIG. 4A. A cross section of each probe 4 is a layered architecture as shown in FIG. 4B.

Figure 5A:
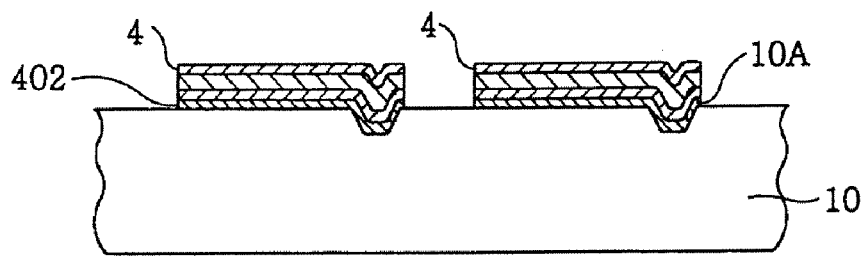
FIGS. 5A to 5G illustrate a process of transferring the probes formed on the silicon substrate, onto an adhesive resin film.

(FIG. 5A) FIG. 5A shows a sectional view of structure that a plurality of probes 4 are formed on the silicon substrate 10 by above-described process.

Figure 5B:
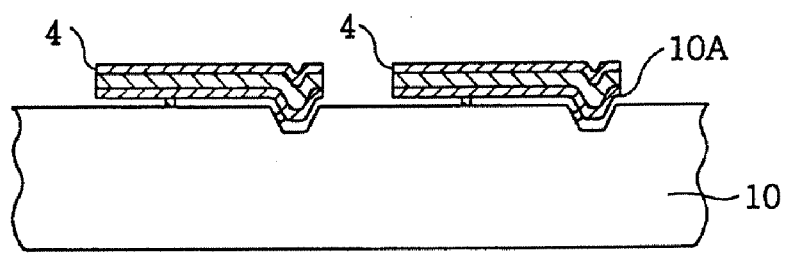

(FIG. 5B) As shown in FIG. 5B, the silicon substrate 10 may be etched to eliminate the peeling layer partially or dimensionally. The etching process may be performed for about 80 seconds for example, by using 5% peroxo ammonium sulfate aquatic solution of a temperature of about 40° C. Resultantly, the peeling layer 402 is partially eliminated. FIG. 5B shows a status in which each probe 4 is detachable from the silicon substrate 10. At this time, each probe 4 is prevented from being completely detached and moved, by leaving a portion of the peeling layer 402 intact. Like this, the portion of the peeling layer 402 is left such that the probe is prevented from being moved and derailed in a transference process which will be described afterward. As shown in FIG. 5B, the silicon substrate 10 is cleaned and dried after the peeling layer 402 is eliminated.

Figure 5C:
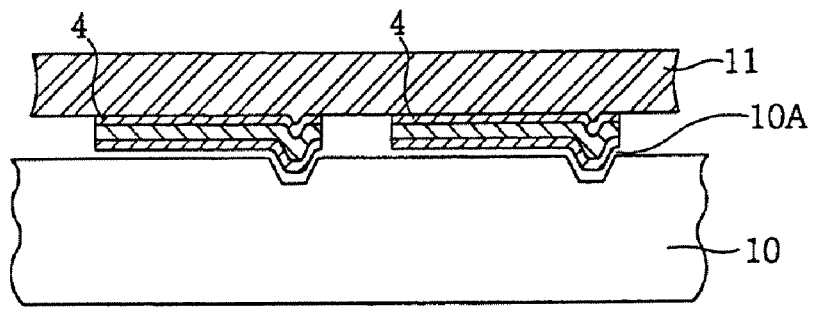
Figure 5D:
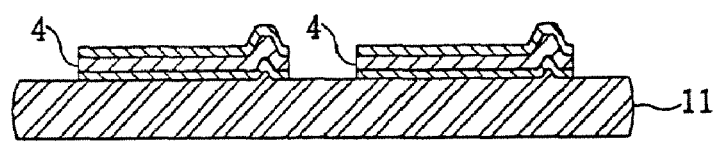

(FIG. 5C) On the surface of the silicon substrate 10 where the probes 4 are formed, a first film-shaped supporting body (hereinafter, referred to as a first adhesive resin film) 11 is installed and the first adhesive resin film is pressed on the silicon substrate 10 by using, e.g., a roller. The first adhesive resin film is made of a material such as a vinyl chloride, polyethylene. The first adhesive resin film may have an adhesive property, wherein an adhesiveness is decreased by heating. The first adhesive resin film 11 is detached from the silicon substrate 10. By the detaching process, each probe 4 is transferred to the first adhesive resin film 11 as shown in FIG. 5C. Further, there is no possibility for the first adhesive resin film 11 to be adhered to the silicon substrate 10 by forming a plurality of the probes 4 on the silicon substrate 10 with a predetermined arrangement density.

(FIG. 5D) There is eliminated a portion of the peeling layer 402 left at each probe 4. As an example of the elimination, the etching process may be performed for about 20 seconds by using 5% peroxo ammonium sulfate aquatic solution of a temperature of about 40° C. Accordingly, the peeling layer 402 is completely eliminated and then the first adhesive resin film 11 is cleaned and dried.

Figure 5E:
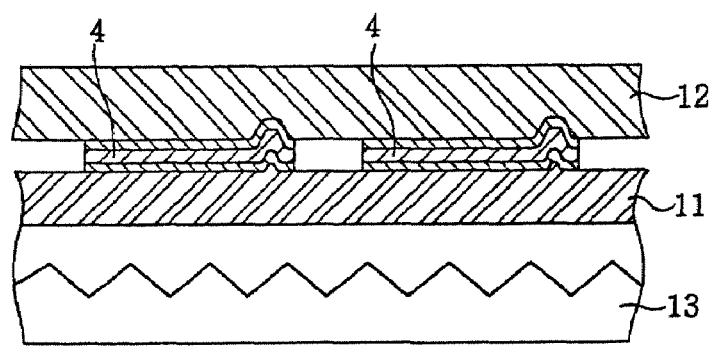

(FIG. 5E) As shown in FIG. 5E, a second film-shaped supporting body (hereinafter, referred to as a second adhesive resin film) 12 is formed on the first adhesive resin film 11, whereby being piled thereon. At least one of the first adhesive resin film 11 and the second adhesive resin film 12 is pressed by, e.g., the roller. The second adhesive resin film 12 is made of a material such as a vinyl chloride, polyethylene. The second adhesive resin film 12 may have an adhesive property, wherein the adhesiveness is decreased by irradiating ultraviolet light thereto.

A process is preferably performed to deteriorate the adhesiveness of the first adhesive resin film 11 by, e.g., heating the first adhesive resin film 11.

After adhering the second adhesive resin film 12 thereto, the first adhesive resin film 11 may be heated for about 10 seconds at a temperature of about 100° C. by using a heater 13. By the heating process, the adhesiveness of the first adhesive resin film 11 is decreased to, e.g., about 1/100 thereof such that the adhesiveness of the first adhesive resin film 11 becomes lower than that of the second adhesive resin film 12. By detaching the first adhesive resin film 11 from the second adhesive resin film 12, a plurality of probes 4 on the first adhesive resin film 11 are transferred to the second adhesive resin film 12.

Moreover, in case of the high adhesiveness of the first adhesiveness resin film 11, a process for reducing the adhesiveness is further preferably performed in addition to the heating process described above. The process is performed by radiating the ultraviolet light UV from a side of the first adhesive resin film 11 by using, e.g., an ultraviolet light radiating apparatus UV.

Figure 5F:
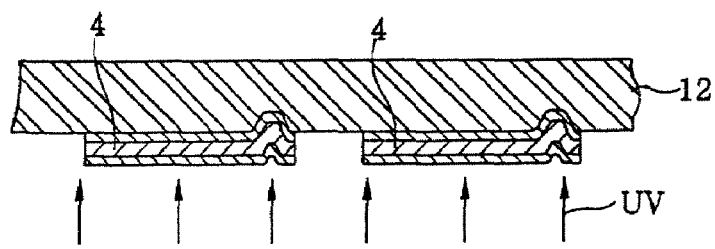

(FIG. 5F) As shown in FIG. 5F, there is performed a process to deteriorate the adhesiveness of the portion of the second adhesive resin film 12, where each probe 4 is not arranged thereon. The process is performed by irradiating the ultraviolet light UV to the second adhesive resin film 12 from a side of the probe 4 with, e.g., the ultraviolet light radiating apparatus UV. The radiation of the ultraviolet light deteriorates the adhesiveness of a portion of the second adhesive resin film 12, where each probe 4 is not provided thereon. In case of the high adhesiveness of the second adhesiveness resin film 12 to the probe 4, the ultraviolet light may be radiated from the reverse side of the surface thereof, where the probe 4 is provided thereon. The radiation diminishes the adhesiveness of the second adhesive resin film 12 to the probe 4.

Figure 5G:
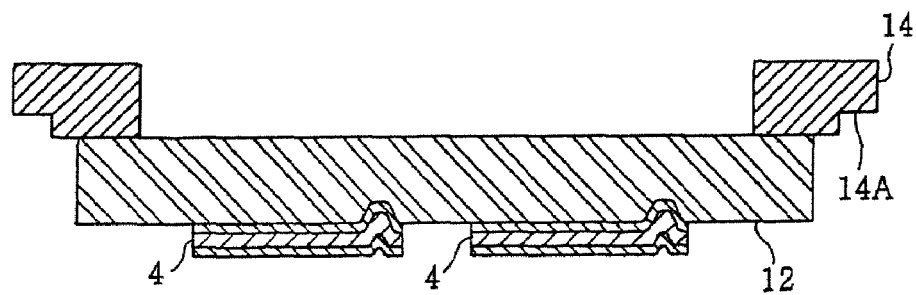

(FIG. 5G) As shown in FIG. 5G, the second adhesive resin film 12, where each probe 4 is transferred, is preferably maintained by a supporting unit 14 by using a glue, a double-sided tape or the like. Further, the supporting unit (hereinafter, referred to as a frame body) 14 may maintain the second adhesive resin film 12 as described later.

A probe attaching apparatus in accordance with the first embodiment is described. The probe attaching apparatus 100 in accordance with the embodiment includes a mounting table 101A for loading thereon the probe card main body 2, a probe supporting unit 103, a probe fixing unit 106 and a position detection unit 105.

The mounting table 101A may include a lifting/rotating unit 101B to support and move the mounting table 101A in Z and/or θ direction and a first moving unit 102 to support and move the mounting table 101A in X and/or Y direction. The mounting table 101A may include a temperature control unit 101C therein to control a temperature of the card main body 2.

The probe supporting unit 103 may support a probe array (the second adhesive resin film) 12, a plurality of probes being maintained thereon detachably therefrom, to be parallel to the probe card main body 2. Further, the probe supporting unit 103 includes a second moving unit 104 movable at least in X and/or Y direction, while maintaining the parallel status to the probe card main body 2.

The position detection unit 105 is a unit for detecting each position thereof to render each supporting column 3 of the probe card main body 2 position matched with the base end 4$b$3 of each probe 4 maintained on the second adhesive resin film 12. Further, the position detection unit 105 may be provided with a first CCD camera 105A and a second CCD camera 105B.

The probe fixing unit 106 may include a fixing unit (e.g., an ultrasonic bonder) 106 for attaching the supporting column 3 of the probe card main body 2 to the base end 4$b$3 of the probe 4.

The probe attaching apparatus 100 may include controllers 108A, 108B (for example, including a microcomputer) to control the aforementioned units in accordance with a previously registered program. Further, the first and the second moving units 102, 104 are movably installed on a base table 107.

Figure 6:
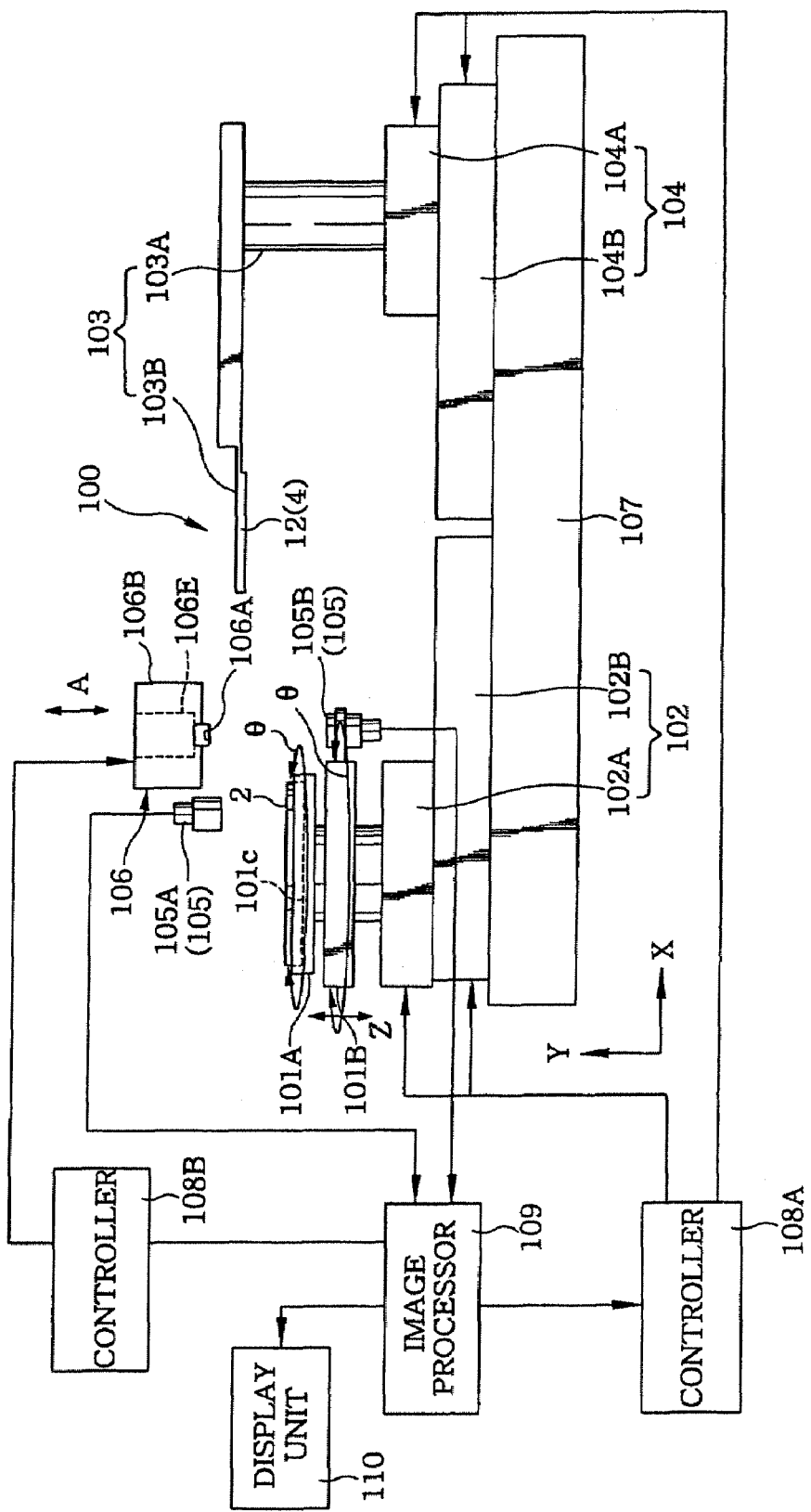
FIG. 6 represents a side view of a probe attaching apparatus in accordance with an embodiment of the present invention.
Figure 7:
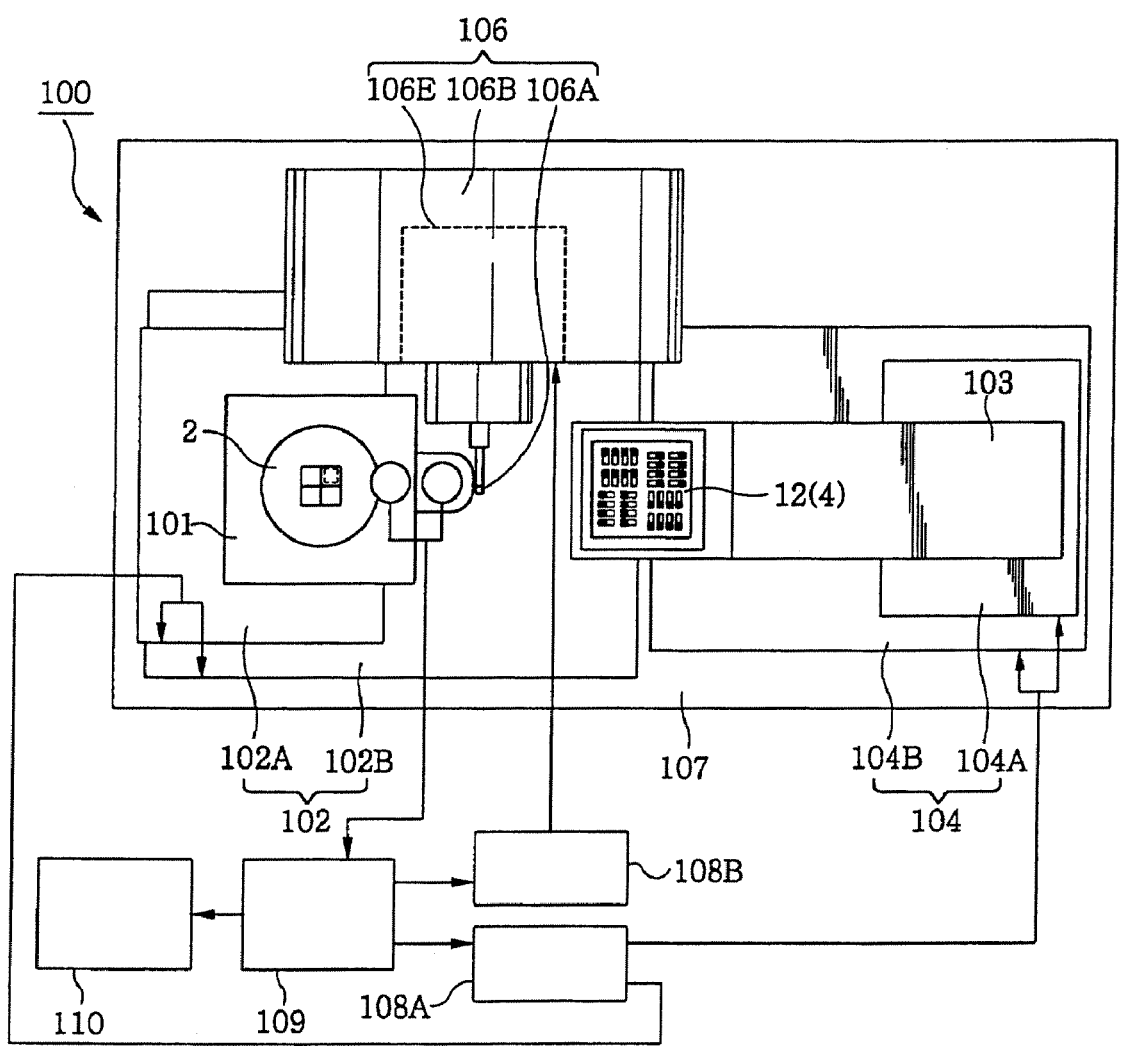
FIG. 7 provides a planar view of the probe attaching apparatus represented in FIG. 6.

The lifting/rotating unit 101B may move the mounting table 101A in a Z direction and a θ direction. The temperature control unit 101C provided in the mounting table 101A heats up the prove card main body 2 up to the temperature of, e.g., 80° C. As shown in FIGS. 6 and 7, the first moving unit 102 may include an X stage 102A moving in an X direction on an X rail (not shown) and a Y stage 102B supporting the X stage 102A and the X rail. The Y stage 102B moves in a Y direction on a Y rail (not shown) which is supported on the base table 107.

As shown in FIGS. 6 and 7, the second moving unit 104 includes an X stage 104A moving in an X direction on an X rail (not shown) and a Y stage 104B supporting the X rail. The Y stage 104B moves in a Y direction on a Y rail (not shown) which is supported by the base table 107.

The probe supporting unit 103 includes a supporting column 103A attached to the X stage 104A of the second moving unit 104 and a frame shaped supporting portion 103B protruded horizontally from the supporting column 103A. One or more than one supporting column 103A may be provided. The supporting portion 103B is maintaining a probe supporting body (frame body) 14 to which the second adhesive resin film 12 is attached with a predetermined tension. A flange 103C is formed in a lower portion of an inner circumference of the supporting portion 103B and the flange 103C fastens and fixes an edge portion 14A of the frame body 14.

As exemplified by referring to FIGS. 6 and 7, the detection unit 105 includes a first CCD camera 105A photographing the contactor substrate 1 on the mounting table 101A from upside, a second CCD camera 105B photographing the probe 4 adhered to the second adhesive resin film 12 supported by the supporting unit 103 from downside, a lighting device (not shown) for illuminating each of the contactor substrate 1 and the probe 4 during photographing thereof, an image processor 109 for processing an image data delivered from the first and the second CCD cameras 105A and 105B, a displaying unit for displaying the image processed by the image processor 109, and controllers 108A and 108B for controlling the first moving unit 102, the second moving unit 104 and the ultrasonic bonder based on the data given from the image processor 109. Each of the first and the second CCD cameras 105A and 105B is installed in a predetermined certain fixed place. The second CCD camera may be installed apart from the mounting table 101A, but preferably fixed near the mounting table (e.g., to the lifting/rotating unit 101B as shown in FIG. 6).

Accordingly, the second CCD camera may move in the Z direction along with the lifting movement of the lifting/rotating unit 101B. The probe fixing unit (e.g., the ultrasonic bonder) 106 includes the bonder 106A and the bonder main body 106B. Further, the bonder main body 106B may include a lifting unit 106E that may move the bonder 106A in the Z direction. The bonder 106A may be moved to the place where the probe 4 contacts with the bump 3 by the lifting unit 106E of the bonder main body 106B.

A designed position information of the target alignment mark 8 is registered in advance in the controller 108A. The controller 108A controls the first moving unit 102 based on the information thereof. The first moving unit 102 moves the mounting table 101A right below the first CCD camera 105A.

The mounting table 101A loading thereon the probe card main body 2 is moved by the lifting/rotating unit 101B in a Z direction and a θ direction and located below the first CCD camera 105A. The first CCD camera 105A may photograph a central position of the alignment mark 8 in the probe card main body 2. A photographed coordinate of the mounting table 101A is delivered to the image processor 109 as real position information of the alignment mark 8 and simultaneously the controllers 108A, 108B store the position information thereof. Similarly, the supporting unit 103 is moved by the second moving unit 104 and located at an upper portion of the second CCD camera 105B. The second CCD camera 105B photographs the contactor 4A of the target probe 4 arranged in a film 12. A coordinate of the second moving unit 104 is stored by the controllers 108A, 108B as real position information of the contactor 4A.

Meanwhile, distance information and direction information between the target alignment mark 8 and an attaching surface 3$a$ of the bump 3 corresponding thereto are already known at a design stage. Consequently, the position information of the bump 3 is automatically outputted based on the already-known values at the design stage by detecting real position information of the target alignment mark 8. At this time, a position where the contactor 4A is fixed to the bump 3 may be outputted similarly. Because each coordinate of the first and the second CCD cameras 105A, 105B and the ultrasonic bonder 106 are already-known, the base end 4$b$3 of the probe 4 may be automatically position-matched with the bump 3 of the probe card main body 2. An array direction of the probe 4 fixed to each bump 3 is previously known. Each probe adapted to the array direction may be selected among the second adhesive resin films 12 supported by the supporting unit 103 with a predetermined tension.

Next, a method for attaching the probe in accordance with an embodiment of the present invention will be described with reference to FIG. 6. The supporting unit (frame body) 14 supports the second film-shaped supporting body (the second adhesive resin film) 12, which has a plurality of probes 4 arranged in a certain array pattern, with a predetermined tension. The frame body 14 is inserted on the supporting unit 103B of the probe supporting unit 103. The probe card main body 2 is loaded on the mounting table 101A, wherein the mounting table 101A is moved in an X and/or a Y direction by the first moving unit 102 and simultaneously moved in a θ and/or a Z direction by the lifting/rotating unit 101B so that the mounting table 101A reaches the right below of the first CCD camera 105A. The first CCD camera 105A searches the alignment mark 8 corresponding to the target bump 3 based on the alignment mark 8 position information of the probe card main body 2 registered previously in a detection unit controller. At this time, the alignment mark 8 corresponding to the target bump 3 may happen to deviate from the position which is based on the position information previously registered in a detection unit controller by tens of μm, which may be caused by, e.g., a thermal expansion of the probe card main body 2. The position deviation is corrected by moving the mounting table 101 in an X and/or a Y direction precisely, so that the mounting table 101 is arranged at the position of the alignment mark 8 corresponding to the target bump 3 right below the first CCD camera 105A. The position deviation results from heating the probe card main body 2 with a temperature of, e.g., 80° C. to facilitate a contact between the bump 3 and the probe 4. The mounting table 101 is moved and the target bump 3 is arranged right below the first CCD camera 105A. After confirming there is no deviation, the coordinate of the bump 3 is stored by the controller. A moving distance at this time is predetermined based on the design value of the probe card 1.

The supporting unit 103 is moved in an X and/or a Y direction by the second moving unit 104 and located right above the second CCD camera 105B. The second moving unit 104 moves the supporting unit precisely in an X and/or a Y direction, while the second CCD camera 105B photographs the probe 4 arranged on the second film-shaped supporting body (an adhesive resin film) 12. Simultaneously, the second CCD camera 105B searches the target contactor 4A of the probe 4 based on a photographed image of the display unit 110. While the second CCD camera 105B photographs the probe 4 arranged on the second adhesive resin film 12, the supporting unit 103 and the second moving unit 104 move the second adhesive resin film 12 in an X and/or a Y direction. The controller compensates a design coordinate of the contactor 4A, which will be initially contacted, with a real coordinate. The controller stores the compensated value. At this time, moving distances of the supporting unit 103 and the second moving unit 104 in an X and a Y direction are calculated by an operation processing part of the controller. An adjustment of the supporting unit in a θ direction may be previously performed manually when the frame body 14, fixing the second adhesive resin film 12 with a predetermined tension, is inserted into the supporting portion 103B of the probe supporting unit 103.

Figure 8A:
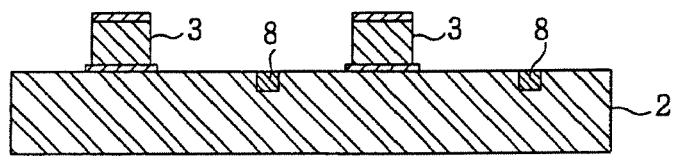
FIGS. 8A to 8E illustrate a process of attaching the probe to the probe card by using the probe attaching apparatus represented in FIG. 6.

(FIG. 8A) FIG. 8A shows a status in which each position compensation for the bump 3 of the probe card main body 2 and the probe 4 of the second adhesive resin film 12 is completed.

Figure 8B:
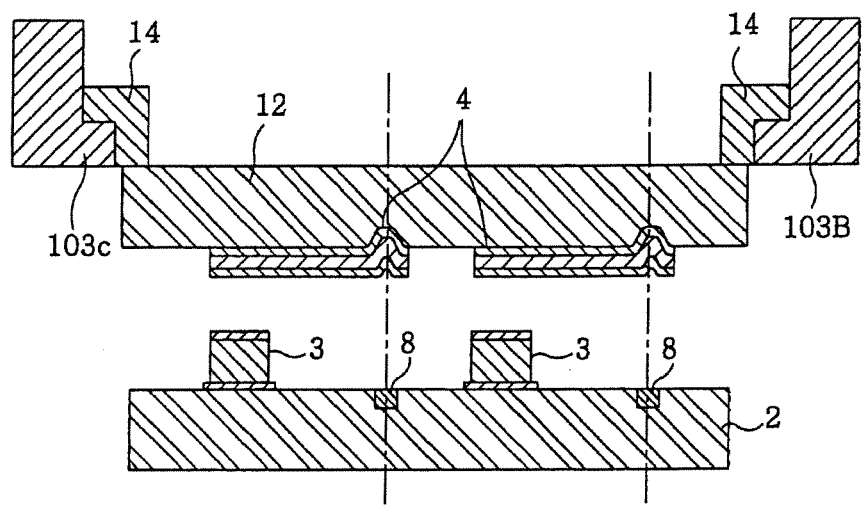

(FIG. 8B) As shown in FIG. 8B, the mounting table 101 is moved by the first moving unit 102 and the bump 3 of the probe card main body 2, which will be initially contacted, is moved right below the probe fixing unit 106A. The supporting unit 103 is moved by the second moving unit 104 to the upside of the mounting table 101 and the probe 4 of the second adhesive resin film 12, which will be initially contacted, is moved right below the probe fixing unit 106A. A contact surface 3A of the bump 3 and the base end 4$b$3 of the probe 4 are aligned in a straight line right below the bonder 106A. At this time, as indicated by a dashed dot line, X and Y coordinates of the alignment mark 8 coincide with those of the contactor 4A.

Figure 8C:
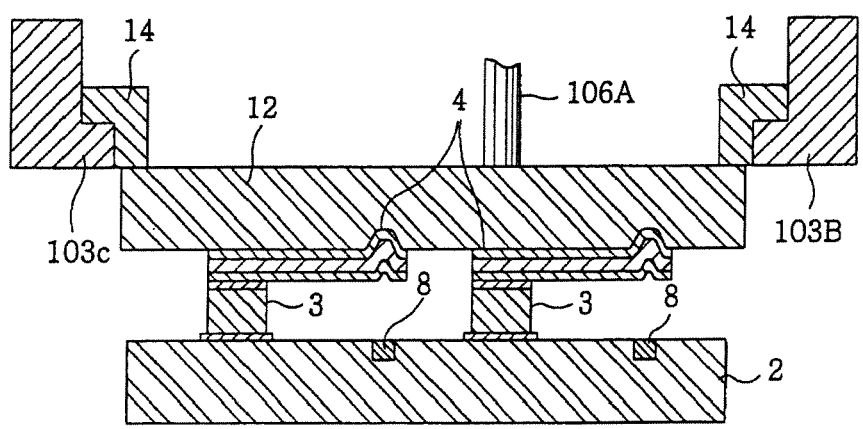

(FIG. 8C) As shown in FIG. 8C, the bump 3 contacts with the base end 4$b$3 of the probe 4 by lifting the mounting table 101. At this stage the ultrasonic bonder 106A is lowered and attaches the bump 3 to the probe 4 by irradiating an ultrasonic wave. At this time, a hole can be easily formed in the second adhesive resin film 12 by, e.g., a pressure of the ultrasonic bonder 106A, thereby an ultrasonic wave attachment being performed smoothly.

The bonder 106A of the ultrasonic bonder 106 is lifted and then the mounting table 101 is lowered by the lifting/rotating unit 101B. The first and the second moving units 102, 104 performs position matching between the bump 3 and the probe 4 which will be attached next, by moving the probe card main body 2 and the second adhesive resin film 12.

For the position matching, the detection unit 105 and the controllers 108A, 108B correct the real coordinates of the bump 3 and the probe 4. As described in detail, the position matching between the bump 3 and the probe 4 is performed in such a way that the first and the second moving units 102, 104 move the mounting table 101 and the supporting unit 103. The ultrasonic bonder 106 is lowered and then attaches both of them. By performing the sequential processes above repeatedly, the probes 4 are attached to all the bumps 3 of the card main body 2.

Figure 8D:
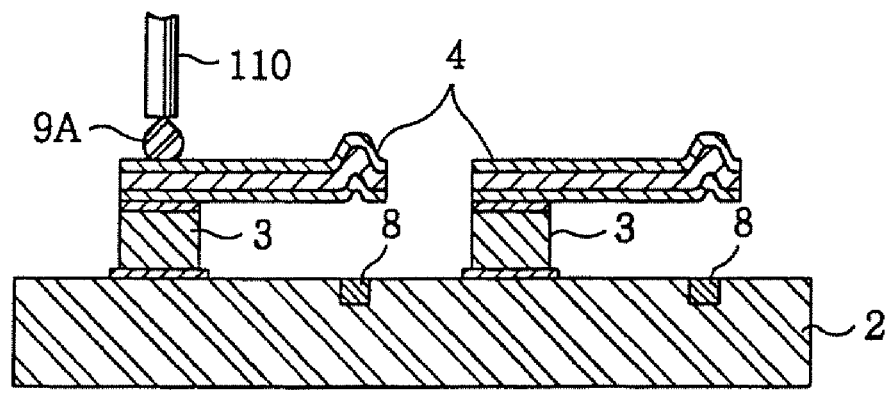
Figure 8E:
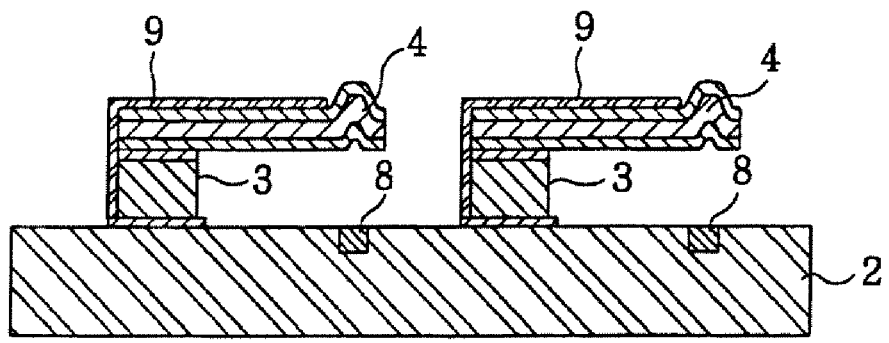

(FIG. 8D) After the probes 4 are attached to all the bumps 3 of the card main body 2, if it is necessary to insulate the attached portion, an insulating material 9A (e.g., polyimide) is spread on the probes 4 and the bump 3 by an spreading apparatus 111 such as micro-dispenser and then the probe card 1 having an insulating film 9 thereon is completed, as shown in FIG. 8D.

As described above, in accordance with the first embodiment of the present invention, a mass production of the probe 4 is possible irrespective of kinds of the probe cards 1. Further, the probe 4 and the contactor 4A are formed together as a single body and applied to different kinds of the probe cards 1. Accordingly, there may be provided the probe 4 having a wide applicability and a good electrical characteristic. Since the contactor 4A formed in a trapezoidal shape can make a stable contact with the electrode pad to thereby make a secure electrical connection therebetween, a highly reliable inspection can be performed.

In accordance with the first embodiment, a photomask of any kind is not needed and the probe cards 4 having various specification may be provided by attaching the probe 4 to the probe card main body, the probe being made by one set of photomasks (e.g., 2 sheets). The probe 4 is attached to the bump 3 of the probe card main body 2 individually so that, when the probe 4 is damaged, a new probe 4 may be attached to the previous bump 3 instead of the damaged probe. In the probe card main body 2, there is provided the stopper 5 limiting the probe pressure of the contactor 4A and the electrode pad of the wafer W. The stopper can maintain the probe pressure at a desirable value and simultaneously prevent the probe from being damaged by the excessive probe pressure. The bump 3 and the stopper 5 are provided together on the card main body 2, thereby both of them may be formed simultaneously on the card main body 2.

The method for manufacturing the probe in accordance with the first embodiment of the present invention includes: forming the frame 10A corresponding to the contactor 4A at a plurality of places on the silicon substrate 10; forming a nickel layer detachably on the silicon substrate 10; forming a plurality of probes 4 having the contactor 4A and the beam 4B, simultaneously by correcting the nickel layer partially; transferring the probe 4 to the first film-shaped supporting body (the first adhesive resin film) 11 detachably; and transferring the probe 4 to the second film-shaped supporting body (the second adhesive resin film) 12 from the first adhesive resin film 11 detachably. Consequently, there may be manufactured the probes 4 massively which are common to various kinds of probe cards.

By arranging a plurality of probes 4 in each of the divided regions (e.g., 4 regions) in such a way that each probe faces a different direction in each region, the degree of freedom can be increased when attaching the probe. By heating the first adhesive resin film 11, the adhesiveness of the first adhesive resin film 11 to the probe 4 is deteriorated. Accordingly, the probe 4 is transferred securely from the first adhesive resin film 11 to the second adhesive resin film 12. By irradiating the ultraviolet light to the second adhesive resin film 12, the probe 4 is transferred securely to the probe card main body 2 from the second adhesive resin film 11. By forming a metal layer on which the probes are formed with nickel having elasticity, the probe pressure needed for inspecting the wafer W can be secured and at the same time the probe 4 may be used repeatedly.

In accordance with the first embodiment of the present invention, the probe attaching apparatus 100 includes: a mounting table 101 for loading thereon the probe card main body 2, wherein the mounting table 101 is movable in X, Y, Z and θ directions; a probe supporting unit 103 for supporting the second adhesive resin film 12, on which a plurality of probes are detachably arrayed thereon, in parallel to the card main body 2, wherein the probe supporting unit 103 is movable in X and Y directions; a position detection unit 105 for detecting a position information to position match the probe card main body 2 with each probe 4 of the second adhesive resin film 12; and an ultrasonic bonder 106 movable in Z direction (a direction of an arrow A in FIG. 6), attaching the probe 4 to the probe card main body 2, after position matching step. By moving the probe card main body 2 in X, Y, Z and θ directions and simultaneously moving the second adhesive resin film 12 in X and Y directions, wherein a plurality of probes 4 are arranged thereon detachably, the probe 4 and the probe card main body 2 are position matched. By attaching the probe 4 to the bump 3 of the probe card main body 2 and then detaching the probe 4 from the second adhesive resin film 12, a small quantity of many different kinds of probe cards may be manufactured economically without a photomask to manufacture the original probe 4. When a portion of the probes 4 in the probe card 1 is damaged, the probe card 1 can be repaired by removing the damaged probe 4 and replacing the damaged probe 4 with a new probe 4.

In accordance with the first preferred embodiment of the present invention, as a mark for position matching when attaching the probe 4, there may be used the alignment mark 8 provided in the prove card main body 2. When attaching the probe 4 to the bump 3 of the probe card main body 2, by using the above mark, the probes 4 may be attached to a predetermined place with a high accuracy even when the card main body 2 expands thermally. In accordance with the first preferred embodiment, the detection unit 105 includes the first CCD camera 105A photographing the card main body 2 and the second CCD camera 105B photographing the probe 4 such that the card main body 2 and the probe 4 can be securely position matched with each other.

The present invention is not limited to the preferred embodiment described above and various changes and modifications of each element may be made without departing from the spirit and scope of the invention. In the preferred embodiment above, the probe card 1 is exemplified. However, the preferred embodiment of the present invention may be applied to manufacturing of the contactor. In the preferred embodiment, the adhesiveness of the first adhesive resin film 11 is decreased by heating thereof, and the adhesiveness of the second adhesive resin film 12 is deteriorated by irradiating the ultraviolet light thereto. However, the reduction of the adhesiveness of each adhesive resin film may be performed conversely. As an attaching apparatus, other attaching apparatus may be used other than the ultrasonic bonder exemplified above.

A process for reducing the adhesiveness of the first adhesive resin film is performed desirably after piling the second adhesive resin film on the first adhesive resin film and further after completing the pressing process. However, the reducing process may be performed prior to the pressing process or before piling the second adhesive resin film.

A second preferred embodiment of the present invention will now be described.

Figure 9:
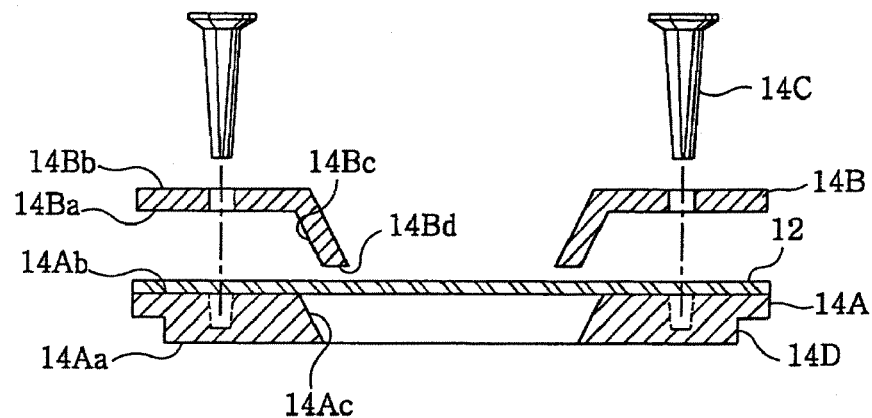
FIG. 9 offers a sectional view of a probe array supporting unit in accordance with another embodiment of the present invention.

Referring to FIGS. 9 to 12, there is described a probe array maintenance unit 14 (hereinafter, referred to as a maintenance unit 14) provided with the probe in accordance with the preferred embodiment of the present invention. FIG. 9 shows one of the preferred embodiments of the maintenance unit 14. The supporting unit 14 for supporting the probe array (e.g., the second adhesive resin film and a plurality of probes) 12 includes a first frame shaped structure 14A; a second frame shaped structure 14B overlapped with the first frame shaped structure 14A; and a locking part 14C fastening and fixing the first and the second frame shaped structures 14A and 14B, which are overlapped with each other.

The second adhesive resin film 12 is supported by the first and the second frame shaped structures 14A and 14B, when the first and the second frame shaped structures 14A and 14B are in stacked state.

The first frame shaped structure 14A includes a first lower surface 14Aa, a first upper surface 14Ab and a first slant surface 14Ac. The second frame shaped structure 14B includes a second lower surface 14Ba, a second upper surface 14Bb, a second slant surface 14Bc and an inner peripheral end 14Bd.

On the first upper surface 14Ab of the first frame shaped structure 14A, there is provided the first slant surface 14Ac declining downward from the outer circumference to the inner circumference of the first frame shaped structure 14A. On the second lower surface 14Ba of the second frame shaped structure 14B, there is provided the second slant surface 14Bc declining downward from the outer circumference to the inner circumference of the second frame shaped structure. A slant angle of the second slant surface 14Bc is preferably coincident with that of the first slant surface 14Ac.

The second adhesive resin film 12 is preferably loaded on the first frame shaped structure 14A so that a surface, the second adhesive resin film 12 being attached thereto, faces the first upper surface 14Ab of the first frame shaped structure 14A. For the loading above, the second adhesive resin film 12 is fixed on the first upper surface 14Ab of the first frame shaped structure 14A by using the adhesiveness. At this time, the second frame shaped structure 14B is piled on the first frame shaped structure 14A. As the second frame shaped structure approaches the first frame shaped structure, the inner peripheral end 14Bd of the second frame shaped structure 14B pushes the second adhesive resin film 12 to thereby let it descend downward. In a state that the second frame shaped structure 14B is completely piled on the first frame shaped structure 14A, the second adhesive resin film 12 is supported by the first and the second frame shaped structure 14A and 14B with a predetermined tension.

There may be employed the locking part 14C such as a bolt, magnetic or a general stopper. In case of adopting the bolt, the bolt is fixed at the first frame shaped structure by penetrating through the second adhesive resin film 12 and the second frame shaped structure 14B. Consequently, the piled state of the first and the second frame shaped structures is maintained.

Figure 10:
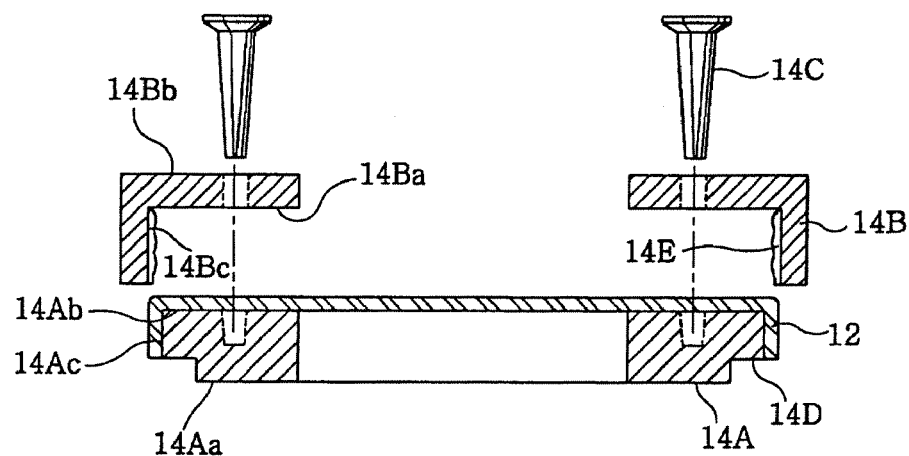
FIG. 10 shows a sectional view of a probe array supporting unit in accordance with still another embodiment of the present invention.

Referring to FIG. 10, another preferred embodiment of the supporting unit 14 is described. The first frame shaped structure 14A includes a first upper surface 14Ab which is flat and a first vertical surface 14Ac around an outer circumference thereof. The second frame shaped structure 14B includes a second upper surface 14Bb which is flat and a second vertical surface 14Bc around an inner circumference thereof. The second adhesive resin film 12 is preferably loaded on the first frame shaped structure 14A so that a surface of the second adhesive resin film 12 where the probe is attached faces the second frame shaped structure 14B.

The second adhesive resin film 12 is installed on the surface of the first frame shaped structure 14A and then the second frame shaped structure 14B is piled thereon. As the second frame shaped structure 14B is piled on the first frame shaped structure 14A, the second adhesive resin film 12 is pushed downward by the second vertical surface. In a state in which the second frame shaped structure 14B is completely piled on the first frame shaped structure 14A, the second adhesive resin film 12 is supported by the first and the second frame shaped structures 14A and 14B with a certain tension.

For the preferred embodiment shown in FIG. 10, the locking part 14C can fix the first and the second frame shaped structures with the second adhesive resin film 12 inserted therebetween.

Further, a friction material 14E is provided on the second vertical surface 14Bc. By employing the friction material 14E on the second vertical surface 14Bc, the second adhesive resin film 12 is pushed down by a stronger force.

Figure 11:
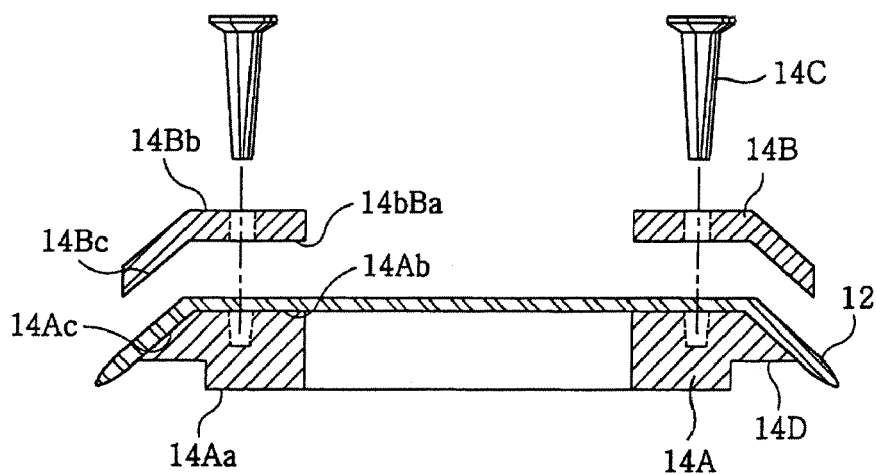
FIG. 11 depicts a sectional view of a probe array supporting unit in accordance with still another embodiment of the present invention.
Figure 12:
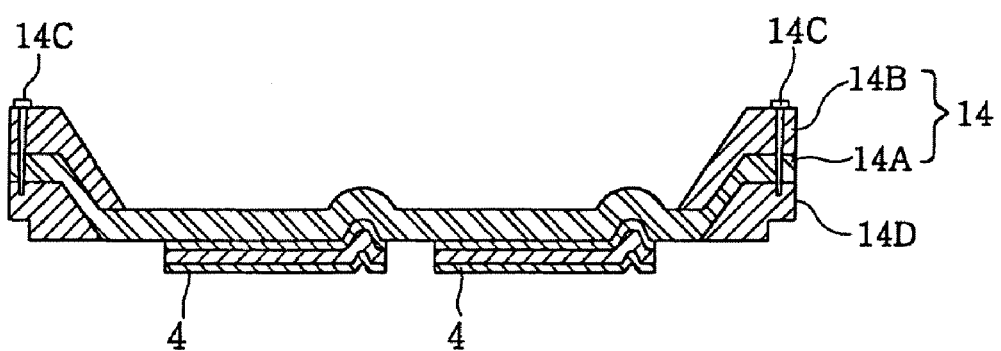
FIG. 12 presents a sectional view of a probe array supporting unit in accordance with still another embodiment of the present invention.

Referring to FIG. 11, another embodiment of the supporting unit 14 will now be described. As shown in FIG. 11, the supporting unit 14 includes the first frame shaped structure 14A and the second frame shaped structure 14B. The first frame shaped structure 14A includes the first upper surface 14Ab and the first upper surface 14Ab has the first slant surface 14Ac declining from the inner circumference to the outer circumference of the first frame shaped structure. The second frame shaped structure 14B has a second lower surface 14Ba and similarly the second lower surface 14Ba has the second slant surface 14Bc declining from the inner circumference to the outer circumference of the second frame shaped structure. The second slant surface 14Bc preferably has a same slant angle as that of the first slant surface 14Ac. The second adhesive resin film 12 is preferably arranged on the first frame shaped structure 14A with a predetermined tension so that a surface of the second adhesive resin film 12, where the probe is attached, faces the second frame shaped structure 14B (a first arrangement example). However, the second adhesive resin film 12 is preferably arranged on the first frame shaped structure 14A so that a surface of the second adhesive resin film 12, where the probe is attached, faces the first frame shaped structure 14A to use the adhesiveness of the second adhesive resin film 12 (a second arrangement example).

In the first arrangement example, the second frame shaped structure 14B is piled on the first frame shaped structure 14A. In a state in which the second frame shaped structure 14B is completely piled on the first frame shaped structure 14A, the second adhesive resin film 12 is supported by the first and the second frame shaped structures 14A and 14B with a certain tension.

In the second arrangement example, the second adhesive resin film 12 is adhered to the first upper surface of the first frame shaped structure 14A by using the adhesiveness thereof. Accordingly, the second frame shaped structure 14B is piled on the first frame shaped structure 14A in a state in which the second adhesive resin film 12 is attached to the first frame shaped structure 14A with a certain predetermined tension. Similar to the first arrangement example, the second adhesive resin film 12 is supported by the first and the second frame shaped structures 14A and 14B with a predetermined tension.

For the embodiments of the supporting unit 14 shown in FIGS. 9 to 12, each of the first frame shaped structure 14A is preferably provided with a cut off portion 14D to be fixed to the probe attaching unit at the outer circumference boundary of the first lower surface 14Aa. The cut off portion 14D is effectively used to securely load the probe array supporting unit 14 on the supporting unit 13 shown in FIG. 6.

Figure 15A:
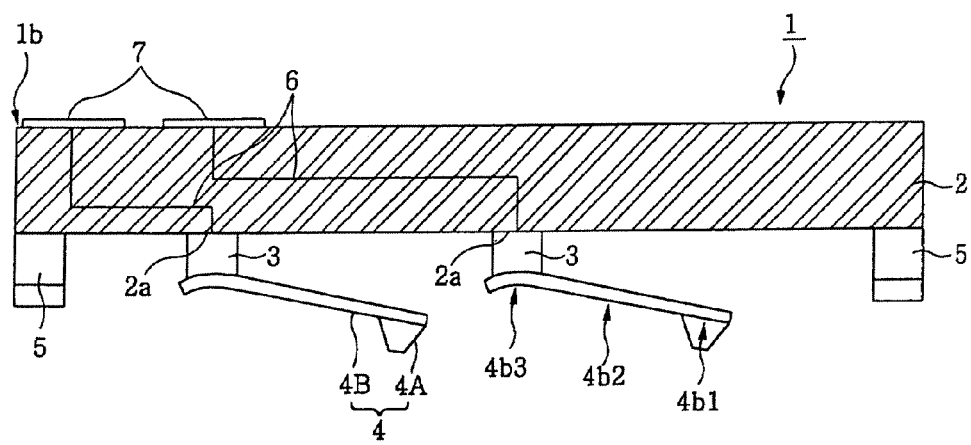
FIG. 15A offers a sectional view of a contactor having the probe in accordance with the present invention and FIG. 15B illustrates an exemplary operation while the probe card shown in FIG. 15A performs an inspection of a wafer.

As shown in FIG. 15A, the probe attached to the bump 3 of the probe card main body 2 includes the beam 4B, and the beam 4B is preferably bent toward the contactor 4A near the base end 4$b$3.

Figure 15B:
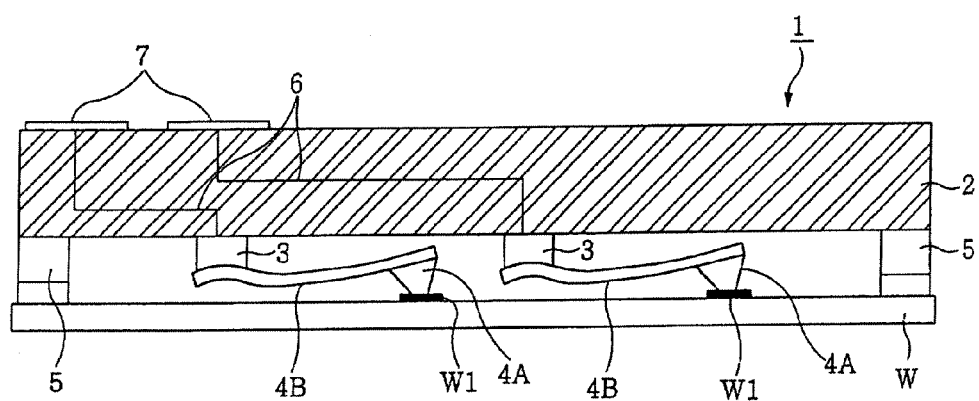

In an inspection state shown in FIG. 15B, the contactor 4A of the bent probe 4 provides a margin to absorb a difference of the heights with respect to the electrode pad W1. Resultantly, the contactor 4A of the probe 4 may be connected to the electrode pad W1 securely.

The probe 4 having the bent beam 4B is manufactured after making a straight beam or after providing the beam 4B with the contactor 4A, by bending the beam 4B near the base end 4$b$3 of the beam 4B. Further, the probe 4 having the bent beam 4B may be manufactured by forming the beam by using the frame with a bent structure.

Moreover, the beam 4B is bent at the attaching step thereof by researching the means for attaching the probe 4 to the bump 3.

Figure 13A:
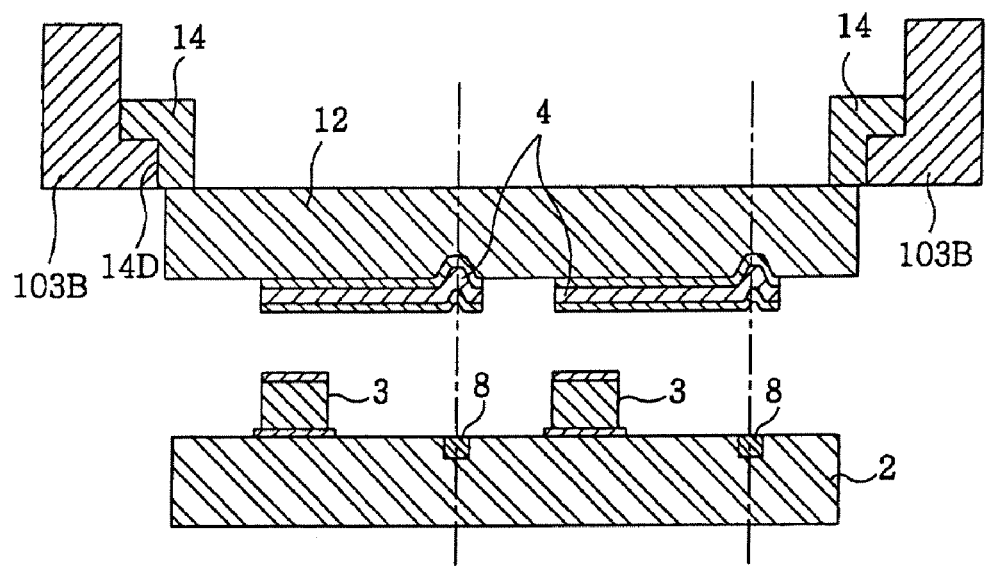
FIGS. 13A to 13D illustrate a process of attaching the probes to the probe card by using the probe attaching apparatuses shown in FIG. 6 and FIG. 14.
Figure 13B:
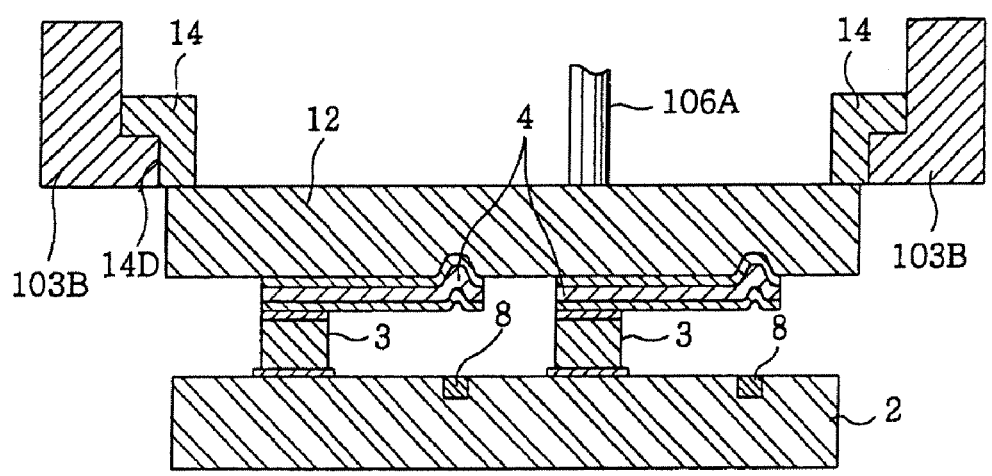
Figure 13C:
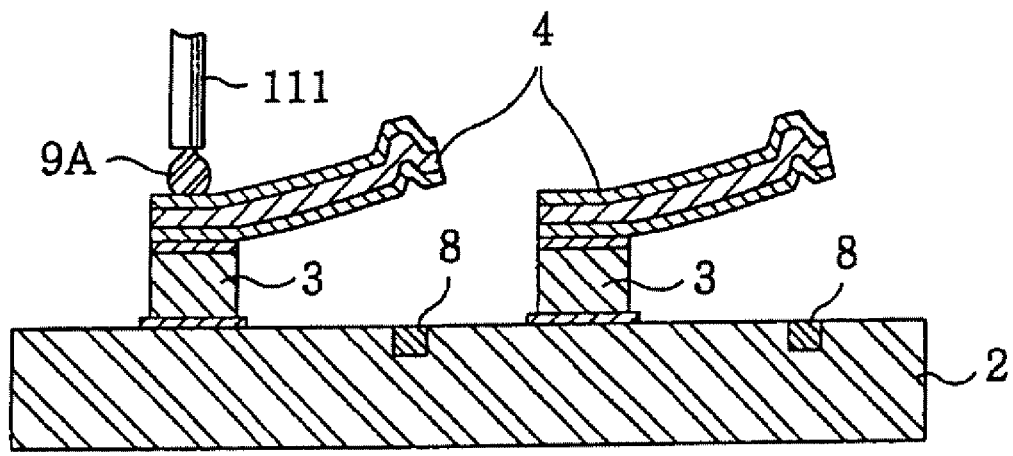
Figure 13D:
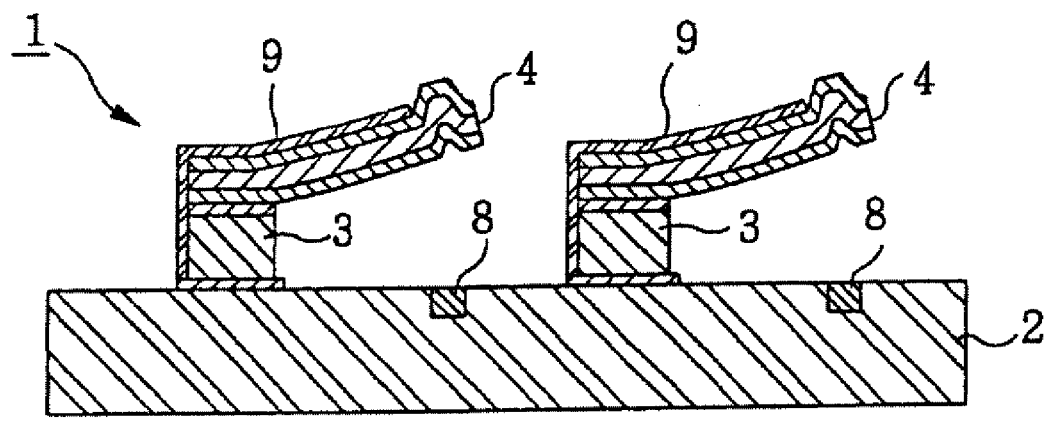
Figure 14:
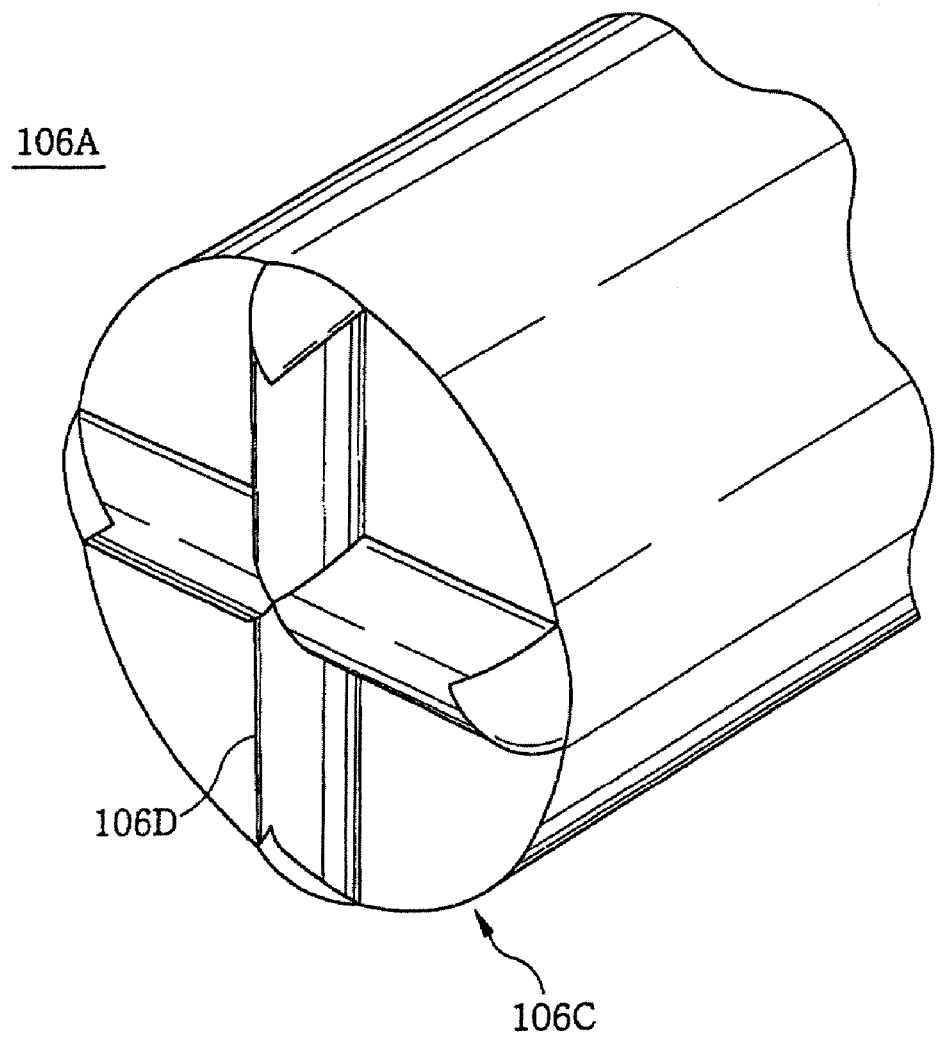
FIG. 14 shows a leading end of an ultrasonic bonder in accordance with another embodiment of the present invention.

Referring to FIGS. 13 and 14, cases of researching the means for attaching is described.

As shown in FIG. 13A, the bump 3 of the probe card main body 2 which will be initially contacted and the probe 4 of the second adhesive resin film 12 which will be initially contacted are position matched with each other. A contact surface 3A of the bump 3 and the base end 4$b$3 of the probe 4 are aligned in a straight line right below the bonder 106A. At this time, as indicated by a dash dotted line in FIG. 13A, X and Y coordinates of the alignment mark 8 coincide with those of the contactor 4A.

As shown in FIG. 13B, the bump 3 contacts with the base end 4$b$3 of the probe 4. At this time, the leading end of the ultrasonic bonder 106A presses the bump 3 and the base end of the probe 4. The bump 3 and the probe 4 are attached with each other by using energy from the ultrasonic bonder 106A.

The leading end 106C of the ultrasonic bonder 106A is preferably provided with a protrusion shape such as a threesome intersection shape or a crossing shape as shown in FIG. 14. The protrusion is preferably a crossing shape. A cross section of the protrusion has a form of a triangle, a semicircle or the like. The cross section of the protrusion is preferably of a semicircle shape.

By using the ultrasonic bonder having the protrusion 106D, as shown in FIG. 13B, the base end of the probe 4 is attached to the bump 3. As shown in FIG. 13C, the beam 4B of the probe 4 may be bent toward the contactor at one of the intermediate portion and the base end of the probe 4 and at the same time can be fixed to the bump 3 strongly. By the bending thereof, the leading end of the probe 4 is preferably raised from the contact part by 10 μm. After the probes 4 are attached to all the bumps 3 of the card main body 2, if it is necessary to insulate the attached portion, an insulating material 9A is spread on the probe 4 and the bump 3 by a spreading apparatus 111 such as micro-dispenser and the probe card 1 having an insulating film 9 thereon is completed, as shown in FIG. 13D.

INDUSTRIAL APPLICABILITY

In accordance with the first and the second embodiment of the present invention, there are provided a probe and a method thereof for mass producing the probe used commonly to the various probe cards, each of which having a different array pattern.

In accordance with the first and the second embodiment of the present invention, a small quantity of many kinds of the probe cards are manufactured economically without a photomask to manufacture the original probe.

There are provided a probe attaching method and an apparatus thereof for manufacturing various probe cards at a low cost, by using one kind of the probe.

In accordance with the present invention, it is provided a probe card manufactured by attaching one kind of the probe based on the array thereof.

It will be understood by those skilled in the art that another characteristics and modifications may be made. Accordingly, the present invention is based on a wide aspect and not limited by the preferred embodiments described herein.

Therefore, various changes and modifications may be made without departing from the spirit and scope of the invention as defined in the following claims and equivalents thereof.

While the invention has been shown and described with respect to the preferred embodiments, it will be understood by those skilled in the art that various changes and modifications may be made without departing from the spirit and scope of the invention as defined in the following claims.

What is claimed is:

1. A method for attaching a base end of a probe to a supporting column placed on a card shaped substrate, comprising the steps of:
    installing the base end of the probe, having a trapezoidal contactor and accommodated in a probe array, on an attaching surface of the supporting column on the card shaped substrate; and
    fixing the base end of the probe to the supporting column by using an ultrasonic bonder having a leading end equipped with a protrusion,
    wherein the probe array includes a second film-shaped supporting body having elasticity; and
    a plurality of probes adhered onto one surface of the second film-shaped supporting body, each probe including a beam and a trapezoidal contactor, an inner part of the contactor being essentially filled with one or more metals,
    wherein the beam has a leading end portion, an intermediate portion and the base end portion, the leading end portion being a portion for making a contact with a test subject via the contactor, and the contactor is installed to be disposed at the leading end portion of the beam, a top portion of the contactor being embedded in the second film-shaped supporting body,
    wherein the step of fixing the base end of the probe to the supporting column is performed by pressing the leading end of the ultrasonic bonder against an upper side of the base end of the probe, and
    wherein the protrusion of the leading end of the ultrasonic bonder has a crossing shape, a cross section of the protrusion being substantially semicircular, and the beam of the probe is bent toward the contractor by fixing the base end of the probe to the supporting column by using the ultrasonic bonder.

* * * * *